United States Patent
Xiao et al.

(10) Patent No.: US 9,041,069 B2
(45) Date of Patent: May 26, 2015

(54) DISTRIBUTED METAL ROUTING

(75) Inventors: You-Cheng Xiao, Taiping (TW); Yen-Huei Chen, Jhudong Township (TW); Jung-Hsuan Chen, Hsin-Chu (TW); Shao-Yu Chou, Chu-Pei (TW); Li-Chun Tien, Tainan (TW); Hung-Jen Liao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 372 days.

(21) Appl. No.: 13/007,235

(22) Filed: Jan. 14, 2011

(65) Prior Publication Data

US 2012/0181707 A1 Jul. 19, 2012

(51) Int. Cl.
| | |
|---|---|
| H01L 23/52 | (2006.01) |
| H01L 23/485 | (2006.01) |
| H01L 23/528 | (2006.01) |
| H01L 23/482 | (2006.01) |
| H01L 23/522 | (2006.01) |

(52) U.S. Cl.
CPC .......... *H01L 23/485* (2013.01); *H01L 23/5286* (2013.01); *H01L 23/4824* (2013.01); *H01L 23/522* (2013.01); *H01L 2924/0002* (2013.01)

(58) Field of Classification Search
CPC .................................................. H01L 23/5286
USPC .................................................. 257/207, 208
See application file for complete search history.

(56) References Cited

U.S. PATENT DOCUMENTS

| | | | | |
|---|---|---|---|---|
| 5,723,908 | A * | 3/1998 | Fuchida et al. | 257/758 |
| 6,305,000 | B1 * | 10/2001 | Phan et al. | 716/120 |
| 6,370,056 | B1 * | 4/2002 | Chen et al. | 365/145 |
| 6,909,153 | B2 | 6/2005 | Ludwig et al. | |
| 7,122,434 | B2 * | 10/2006 | Ludwig et al. | 438/275 |
| 8,378,491 | B2 * | 2/2013 | Gietler et al. | 257/758 |
| 2001/0045653 | A1 | 11/2001 | Madan | |
| 2002/0056887 | A1 * | 5/2002 | Horstmann et al. | 257/508 |

FOREIGN PATENT DOCUMENTS

CN 1395307 2/2003

OTHER PUBLICATIONS

NOR + Driver Layout Style, drawing, Taiwan Semiconductor Manufacturing Company, Ltd., Hsin-Chu, Taiwan, 1 page, 2010.

* cited by examiner

*Primary Examiner* — Phat X Cao
(74) *Attorney, Agent, or Firm* — Slater & Matsil, L.L.P.

(57) ABSTRACT

A system and method for a distributed metal routing is disclosed. An embodiment comprises a metal_0 layer with a metal_1 layer overlying the metal_0 layer. The metal_1 layer comprises separate parallel lines, with lines having different signals being distributed across the metal_1 layer. Such a layout decreases the parasitic resistance within the metal_0 layer as it decreases the distance current travels. Additionally, the distributed layout in metal_1 allows connections to be made to a metal_2 layer without the need for a hammer head connection of vias.

20 Claims, 7 Drawing Sheets

DISTRIBUTED METAL ROUTING

TECHNICAL FIELD

Embodiments relate generally to a system and method for a metal layer layout and, more particularly, to a system and method for laying out a first metal layer in a semiconductor device.

BACKGROUND

As the miniaturization of semiconductor elements and routing has progressed down to the 20 nm technology node, a new metallization layer known as metal_0 has been introduced in contact with the substrate itself in order to provide for extra routing resources. The metal_0 layer has been introduced to electrically connect portions of the substrate with other nearby portions of the substrate without routing the connection into an overlying first metal layer (separated from the substrate by an inter-layer dielectric layer). As such, the connections that used to be located in the original metal_1 layer in the previous technology nodes (such as the 28 nm technology node) were migrated into the new metal_0 layer, the connections that were originally located in the old metal_2 layer were migrated into the new metal_1 layer, the connections that used to be located in the old metal_3 layer were migrated into the new metal_2 layer, and so forth.

However, with the introduction of the metal_0 layer also came a corresponding parasitic resistance in the metal_0 layer. This parasitic resistance caused an IR drop and a larger signal RC delay because the current became crowded with the reduction in size (from, e.g., 28 nm technology node to a 20 nm technology node). Such degradations in the resistance, the IR drop, and the RC delay, cause a degradation in the performance of the device to the point where these limitations are becoming the leading limitations in the minimum operating voltage of devices.

Additionally, the introduction of metal_0 also has implications in the new metal_2 layers. Because at least two vias may be needed to connect the metal_2 layer to the metal_1 layer in order to address yield and signal concerns, a single track (or line) in the metal_2 layer may need to be expanded over its desired connection in order to accommodate the two vias. Such an expansion over the via connections is known as a "hammer head" and can actually double the width of the track over the desired connection. Such doubling of the width can cause either large design issues (as other tracks in the metal_2 layer are designed to conform to the suddenly enlarged width) or else the complete elimination of an entire track in the metal_2 layer in order to make room for the "hammer head."

BRIEF DESCRIPTION OF THE DRAWINGS

For a more complete understanding of embodiments, and the advantages thereof, reference is now made to the following descriptions taken in conjunction with the accompanying drawings, in which:

FIGS. 3A-4C illustrate cross-sectional views of the metal_1 layer layout in accordance with an embodiment;

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that embodiments provide many applicable inventive concepts that can be embodied in a wide variety of specific contexts. The specific embodiments discussed are merely illustrative of specific ways to make and use the embodiments, and do not limit the scope of the embodiments.

Embodiments will be described with respect to embodiments in a specific context, namely a metal_1 layer located over a metal_0 layer over an active area in a 20 nm technology node. Embodiments may also be applied, however, to other metal layer layouts in other technology nodes.

Figure 1:
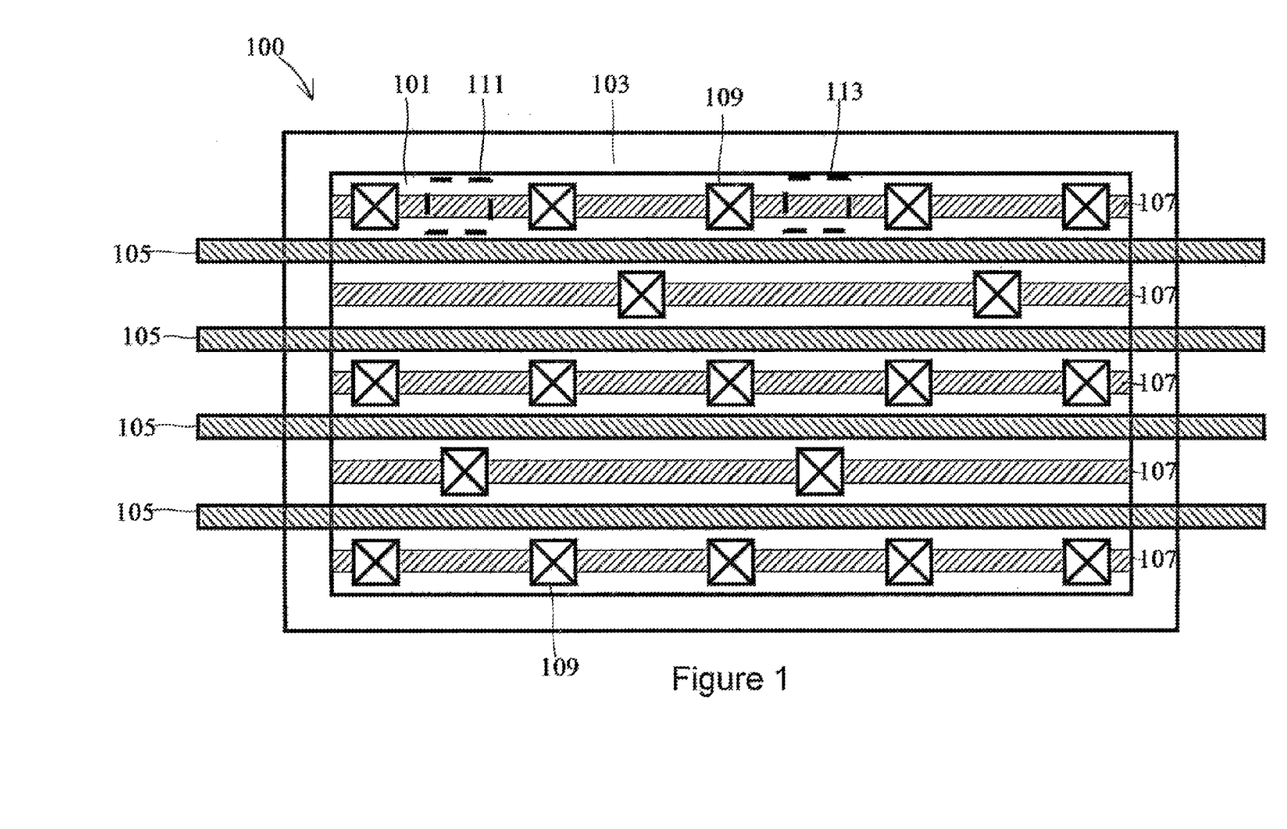
FIG. 1 illustrates an active area, metal_0 layer and via_0s in accordance with an embodiment.

With reference now to FIG. 1, there is shown a top down view of a substrate 100 with an active area 101 (e.g., oxide definition area) surrounded by an isolation region 103 (e.g., shallow trench isolation). The active area 101 may be a region of silicon that has been activated through, e.g., implantation of dopants in order to conduct electricity in a particular fashion. The active area 101 may be doped with p-type dopants (such as boron, aluminum, gallium, or indium) and n-type dopants (such as phosphorous, arsenic, or antimony), in order to form one or more types of semiconductor devices, such as a multi-finger transistor as illustrated in FIG. 1. However, other devices such as single-finger transistors, resistors, or the like or more complicated semiconductor structures such as SRAM cells, NOR gates, OR gates, drivers, combinations of these, or the like may also be formed with the active area 101. The active area 101 may be formed through one or more series of implantations in which the p-type and n-type dopants are implanted while regions in which doping is undesired may be protected through, e.g., masking layers.

The isolation region 103 may be shallow trench isolations (STIs). Generally, STIs may be formed by etching the substrate 100 around the active area 101 to form trenches and filling the trenches with a dielectric material as is known in the art. Preferably, the trenches are filled with a dielectric material such as an oxide material, a high-density plasma (HDP) oxide, or the like, formed by conventional methods known in the art. However, other types of isolation structures could alternatively be used to isolate the active area 101.

Additionally, while not explicitly shown in FIG. 1, the isolation region 103 may not be limited to the outer edge of the active area 101. Rather, the isolation region 103 may be placed to separate different regions of the active area 101 that are desired to be separated from each other. For example, if different sources and drains for the multi-finger transistor are desired to be separated from each other, the isolation region 103 may be formed or extended into the interior of the active area 101 in order to provide the desired isolation. Any combination and layout of active area 101 and isolation region 103 may alternatively be utilized in these embodiments, and the embodiment in which the isolation region 103 surrounds the active area 101 is not intended to be limiting in any fashion.

FIG. 1 also illustrates gate electrodes 105 and a metal_0 layer 107 which overlie the active area 101 in order to form, e.g., channel regions within the active region in order to form working devices such as transistors. Gate electrodes 105 may comprise a conductive material such as Ta, Ti, Mo, W, Pt, Al, Hf, Ru, and silicides or nitrides thereof, doped polysilicon, other conductive materials, or a combination thereof. For example, amorphous silicon may be deposited over a gate dielectric (hidden by the gate electrodes 105 shown in FIG. 1) and recrystallized to create poly-crystalline silicon (polysilicon). In an embodiment in which the gate electrodes 105 are polysilicon, gate electrodes 105 may be formed by depositing doped or undoped polysilicon by low-pressure chemical vapor deposition (LPCVD) to a thickness in the range of about 400 Å to about 2500 Å, but more preferably about 1500 Å.

The metal_0 layer 107 may be used to form interconnections between various regions (e.g., a first region 111 (represented by the dotted line labeled 111) and a second region 113 (represented by the dotted line labeled 113)) of the active area 101. Additionally, the metal_0 layer 107 may also provide connections not only between various regions of the active area 101, but may also provide connections between the active area 101 and other nodes through connections to the metal_1 layer 201 (not shown in FIG. 1 but discussed further below with respect to FIG. 2). The metal_0 layer 107 may be formed utilizing a first dielectric layer (not shown in FIG. 2 for clarity), such as a combination silicon nitride layer and silicon oxide layer, that may be formed over the active area 101, the gate electrodes 105, and the metal_0 layer 107. Once the dielectric layer has been formed, openings may be etched through the first dielectric layer to expose portions of the active area 101 (which may optionally have a silicide component which may be exposed by the etching), with the opening being extended to cover the regions to which connections are desired, such as the first region 111 and the second region 113. The openings may be lined with titanium nitride and filled with a conductor such as tungsten or copper, thereby forming an electrical connection without being routed to the metal 1 layer.

Once the metal_0 layer 107 has been formed, a second dielectric layer (also not shown in FIG. 2 for clarity) may be formed over the metal_0 layer 107, the active area 101, and the gate electrodes 105. Via_0s 109 (e.g., contact plugs) may be formed within the second dielectric layer to connect the metal_0 layer 107 or the gate electrodes 105 to the metal_1 layer 201. The via_0s 109 may be formed within the dielectric layer by etching through the dielectric layer to either the metal_0 layer 107 or the gate electrodes 105, thus forming via_0 holes. In an embodiment, a photoresist (not shown) may be deposited and patterned to mask off the non-exposed regions to a subsequent etching step. The dielectric layer may then be etched down to the metal_0 layer 107 and the gate electrodes 105 using a suitable etching process. Once the etch is complete, the photoresist may be removed.

The via_0s 109 may be formed by a deposition of conductive material. A conductive liner may be deposited prior to filling the via_0 holes with the conductive material. The conductive liner may be conformal, and may comprise a single layer of Ta, TaN, WN, WSi, TiN, Ru and combinations thereof, as examples. The conductive liner may also be used as a barrier layer for preventing metal from diffusing into the underlying layers. These liners are deposited, for example, using a Chemical Vapor Deposition (CVD), Plasma Vapor Deposition (PVD) or Atomic Layer Deposition (ALD) process.

The conductive material may then be deposited similarly using, for example, a CVD, PVD or ALD process over the first insulating layer to fill the via_0 holes. Excess portions of the conductive material may be removed from the top surface of the insulating layer, e.g., using a chemical mechanical polishing (CMP) process, thus forming the via_0s 109. The conductive material may comprise W, although copper, aluminum, Al—Cu—Si, other metals and combinations thereof may also be used. If the conductive material comprises W, a bi-layer seed layer comprising CVD titanium nitride and silicon doped tungsten may be used. In some embodiments, the via_0s 109 may be filled with copper, forgoing the titanium nitride liner which may be problematic in deeply scaled technologies.

Figure 2:
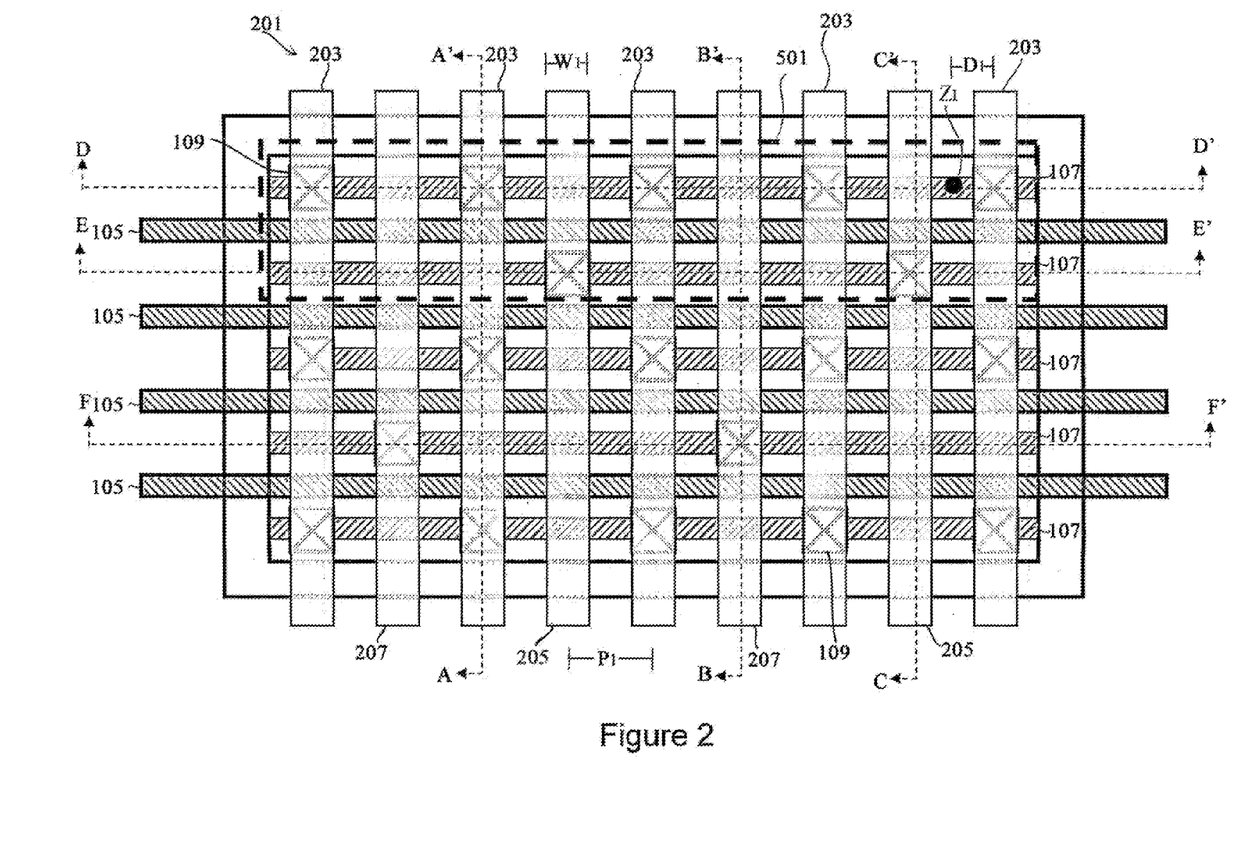
FIG. 2 illustrates a metal_1 layer layout in accordance with an embodiment.

FIG. 2 illustrates metal_1 layer 201 overlying the active area 101, the isolation region 103, the gate electrodes 105, the metal_0 layer 107, and the via_0s 109 (the dotted line 501 is discussed below with respect to FIG. 5). The metal_1 layer 201 may be formed, e.g., through a damascene or dual-damascene process, in which a second dielectric layer (not shown in FIG. 2 for clarity) is formed, openings are etched into the second dielectric layer and the openings are overfilled with a conductive material, which is then planarized.

As an example only, the metal_1 layer 201 may be formed of any suitable conductive material, such as a highly-conductive, low-resistive metal, elemental metal, transition metal, or the like. In an embodiment the metal_1 layer 201 may be formed of copper, although other materials, such as tungsten, could alternatively be utilized. In an embodiment in which the metal_1 layer 201 is formed of copper, the metal_1 layer 201 may be deposited by electroplating techniques known in the art, although any method of formation could alternatively be used.

For example, an opening (not shown) may be formed by applying and developing a suitable photoresist (not shown), and then etching the second dielectric layer to expose the desired contacts to the metal_0 layer 107 and the gate electrodes 105. A liner (not shown) may be formed over the second dielectric layer in the openings, the liner covering the sidewalls and bottom of the opening. The liner may be either tetraethylorthosilicate (TEOS) or silicon nitride, although any suitable dielectric may alternatively be used. The liner may be formed using a plasma enhanced chemical vapor deposition (PECVD) process, although other suitable processes, such as physical vapor deposition or a thermal process, may alternatively be used.

A barrier layer (also not shown) may be formed over the liner and covering the sidewalls and bottom of the opening. The barrier layer may be formed so as to conformally cover the liner and the sidewalls and bottom of the opening with a thickness of between about 10 Å and about 1,000 Å, such as between about 20 Å and about 100 Å. The barrier layer may be formed using a process such as chemical vapor deposition (CVD), physical vapor deposition (PVD), plasma enhanced CVD (PECVD), plasma enhanced physical vapor deposition (PEPVD), atomic layer deposition (ALD), combinations of these, or the like. The barrier layer may comprise tantalum nitride, although other materials, such as tantalum, titanium, titanium nitride, combinations of these, and the like may alternatively be used. Additionally, in an embodiment the barrier layer may be alloyed with an alloying material such as carbon or fluorine, although the alloyed material content is generally no greater than about 15% of the barrier layer, and may be less than about 5% of the barrier layer. The alloying material may be introduced by one of the precursors during formation of the barrier layer in the CVD, PVD, ALD, PECVD, or PEPVD processes.

A seed layer (not shown) may be formed over the barrier layer. The seed layer may be deposited by PVD or CVD, and may be formed of copper, although other methods and materials may alternatively be used if desired. Optionally, the seed layer may also be alloyed with a material that improves the adhesive properties of the seed layer so that it can act as an adhesion layer. For example, the seed layer may be alloyed with a material such as manganese or aluminum, which will migrate to the interface between the seed layer and the barrier layer and will enhance the adhesion between the two layers. The alloying material may be introduced during formation of the seed layer, and may comprise no more than about 10% of the seed layer, such as about less than 5%.

A conductive material (not shown) may be formed onto the seed layer. The conductive material may comprise copper, although other suitable materials such as aluminum, alloys, doped polysilicon, combinations thereof, and the like, may alternatively be utilized. The conductive material may be formed by electroplating copper onto the seed layer, filling and overfilling the openings. Once the openings have been filled, excess liner, barrier layer, seed layer, and conductive material outside of the openings may be removed through a planarization process such as chemical mechanical polishing (CMP), although any suitable removal process may be used.

Additionally, FIG. 2 also illustrates that the metal_1 layer 201 is laid out in a distributed fashion in order to reduce the parasitic resistance of the metal_0 layer 107. For example, the metal_1 layer 201 may have multiple Vss lines 203 connected to a Vss source that are distributed over the metal_1 layer 201 instead of a single Vss line. By having multiple Vss lines 203 that connect to different parts of the metal_0 layer 107, the path that current has to follow to reach any point of the metal_0 layer 107 is only as long as the distance from that point to the nearest Vss line 203.

For example, given a point $Z_1$ illustrated in FIG. 2, the distributed layout of Vss lines 203 allows the distance current has to travel through the metal_0 layer to reach point $Z_1$ be no greater than the distance to the nearest Vss line 203, or the distance $D_1$. If there were only a single, non-distributed Vss line, this distance may be much greater.

Additionally, in order to reduce the current crowding, first signal lines 205 connected to a first signal source and second signal lines 207 connected to a second signal source may also be distributed to provide easier and closer connections to the desired points of the metal_0 layer 107. Additionally, the first signal lines 205 and second signal lines 207 may be placed in between the distributed Vss lines 203. By placing the first signal lines 205 and second signal lines 207 between the distributed Vss lines 203, the overall resistance for the device may be reduced, leading to an improved IR drop and reduce the RC delay for the devices.

As an example only, the metal_1 layer 201, as illustrated in FIG. 2, may have a distributed layout (from left to right in FIG. 2) of Vss line 203, second signal line 207, Vss line 203, first signal line 205, Vss line 203, second signal line 207, Vss line 203, first signal line 205, and Vss line 203. However, as one of ordinary skill in the art will recognize, this particular layout is not the only available layout and is not meant to be limiting to the present embodiments. Any distributed layout, such as having multiple signal lines between the Vss lines 203 (e.g., having a first signal line 205 and a second signal line 207 or else having two first signal lines 205 between Vss lines 203) may alternatively be utilized. All of these layouts are fully intended to be included within the scope of the embodiments.

Metal_1 layer 201 may be formed such that the Vss lines 203, the first signal lines 205, and the second signal lines 207 all have a similar width $W_1$, although they may alternatively have different widths if desired. For example, the Vss lines 203, the first signal lines 205, and the second signal lines 207 may all have a width $W_1$ of between about 32 nm and about 54 nm, such as about 32 nm. Additionally, the Vss lines 203, the first signal lines 205, and the second signal lines 207 may be distributed with a similar pitch $P_1$ relative to each other, wherein the pitch $P_1$ may be between about 64 nm and about 86 nm, such as about 84 nm.

Figure 3A:
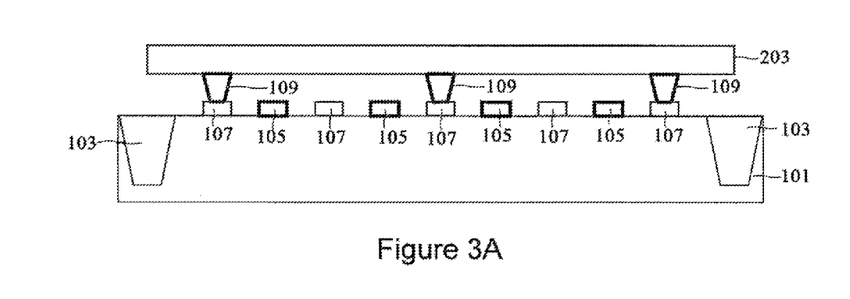
Figure 3B:
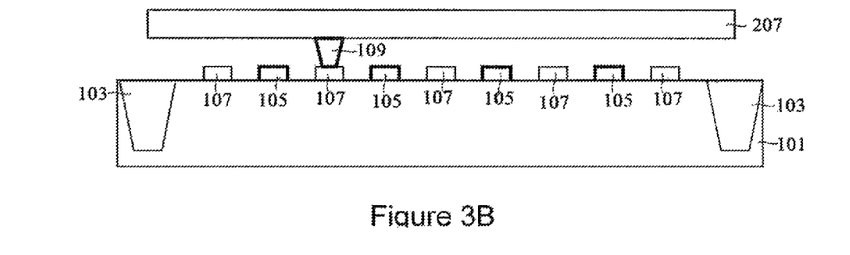
Figure 3C:
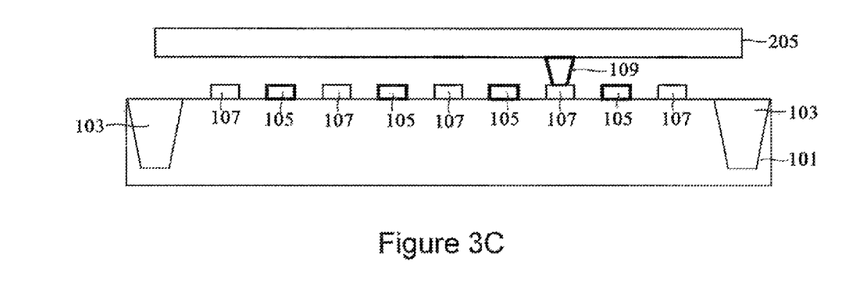

FIGS. 3A-3C illustrate cross-sectional views of the metal_1 layer 201. FIG. 3A illustrates the cross-sectional view through line A-A' of FIG. 2 and illustrates the connection of Vss line 203 to the metal_0 layer 107. As illustrated, the Vss line 203 of the metal_1 layer 201 may be connected to multiple points of the metal_0 layer 107 through, e.g., multiple ones of the via_0s 109.

FIG. 3B illustrates the cross-sectional view through line B-B' and illustrates the connection of the second signal line 207 to the metal_0 layer 207 (although a different portion than the Vss line 203). As illustrated, the second signal line 207 may be connected to the metal_1 layer 201 through, e.g., a single one of the via_0s 109.

FIG. 3C illustrates the cross-sectional view through line C-C' and illustrates the connection of a first signal line 205 to a gate electrodes 105 using, e.g., yet another one of the via_0s 109. As illustrated, the first signal line 205 may be connected to yet another portion of the metal_0 layer 107 through, e.g., a single one of the via_0s 109.

Figure 4A:
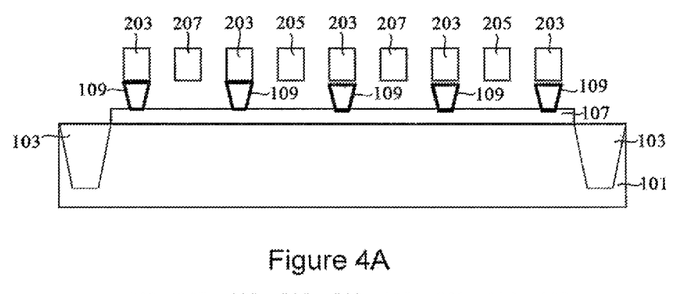
Figure 4B:
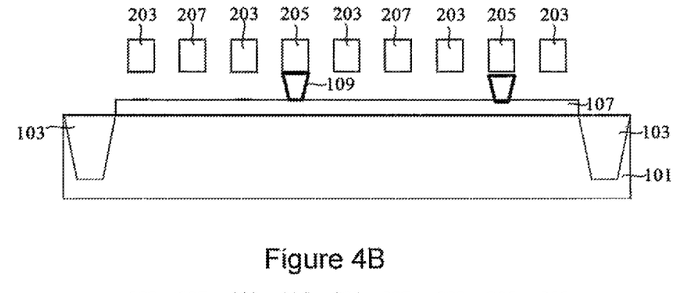
Figure 4C:
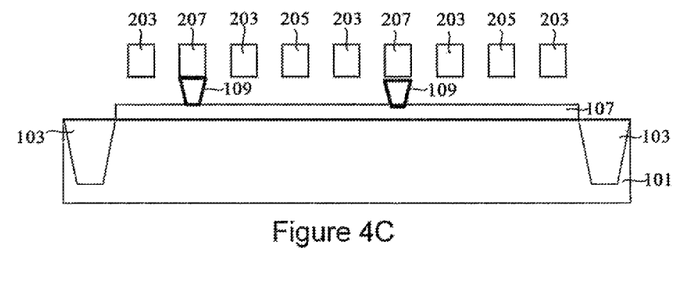

FIGS. 4A-4C illustrate additional cross sectional views of the metal_1 layer 201. FIG. 4A illustrates the cross-sectional view through line D-D' and illustrates the connection of Vss line 203 to the metal_0 layer 207. As illustrated, multiple Vss lines 203 may be connected to the metal_0 layer 207 through multiple ones of the via_0s 109. By allowing for multiple Vss lines 203 to connect to the metal_0 layer 107, the distance that current has to travel through the metal_0 layer 107 to get to any point in the metal_0 layer 107 may be greatly reduced, thereby reducing the overall parasitic resistance of the metal_0 layer 107.

FIG. 4B illustrates the cross-sectional view through line E-E' and illustrates the connection of the first signal lines 205 to the metal_0 layer 107. As illustrated, multiple first signal lines 205 in the metal_1 layer 201, all of which may carry a similar signal, connect to the metal_0 layer 107 through, e.g., via_0s 109. Again by spacing the connections into a number of distributed lines within the metal_1 layer 201, the parasitic resistance of current traveling to any point within the metal_0 layer 107 may be reduced. Additionally, by providing multiple connections between the metal_0 layer 107 and the first signal lines 205 through the distributed layout, any needs for multiple connections (such as may be required to address yield and signal concerns) may be met without extending the width of the first signal line 205 within the metal_1 layer 201 in the "hammer head" design.

FIG. 4C illustrates the cross-sectional view through line F-F' and illustrates the connection of the second signal lines 207 to the metal_0 layer 107. As illustrated, multiple second signal lines 207 in the metal_1 layer 201, all of which may carry a similar signal, connect to the metal_0 layer 107 through, e.g., via_0s 109. Again by spacing the connections into a number of distributed lines within the metal_1 layer 201, the parasitic resistance of current traveling to any point within the metal_0 layer 107 may be reduced. Additionally, by providing multiple connections between the metal_0 layer 107 and the second signal lines 207 through the distributed layout, any needs for multiple connections (such as may be required to address yield and signal concerns) may be met without extending the width of the second signal lines 207 within the metal_1 layer 201 in the "hammer head" design.

Figure 5:
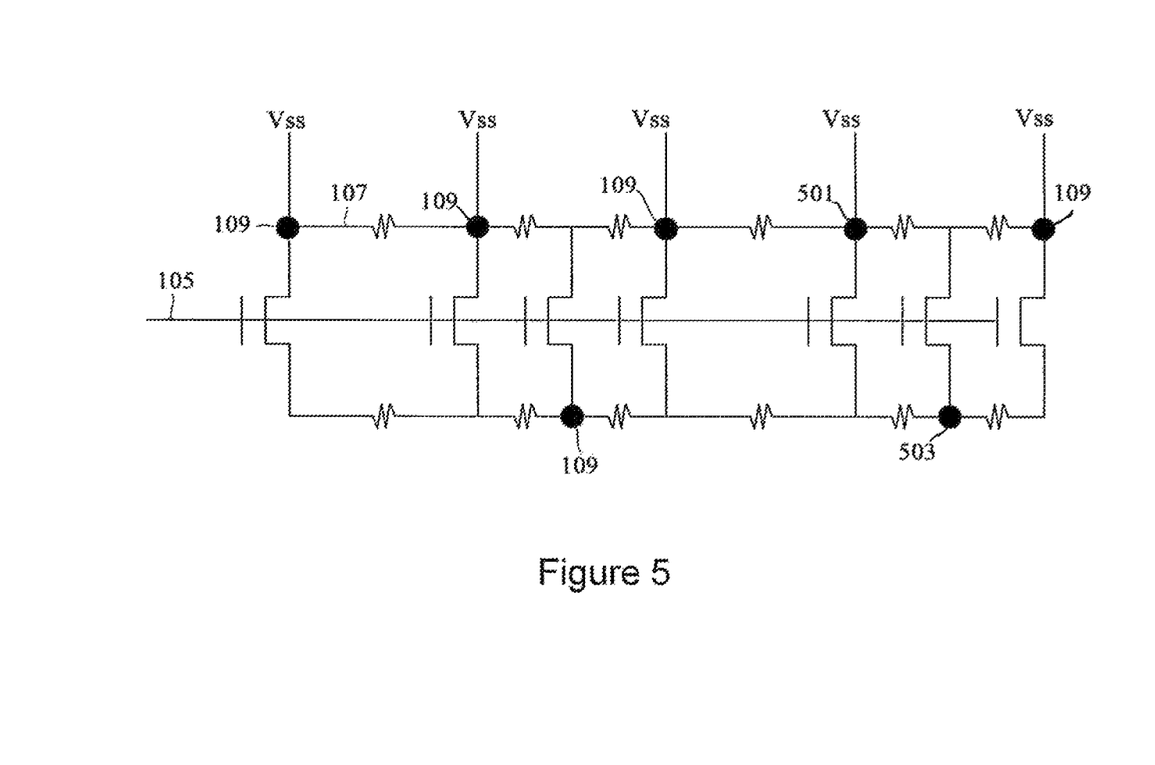
FIG. 5 illustrates a circuit diagram representation of a portion of the metal_1 layer layout in accordance with an embodiment.

FIG. 5 illustrates a circuit diagram representative of the effective resistances of the structures within dotted line 501 in FIG. 2. As shown, by distributing the Vss lines 203 and the first signal lines, the effective distance between a first metal_0 connection 501 (through, e.g., a via_0 109 that has been labeled 501) that connects the metal_0 layer 107 to the Vss lines 203 and a second metal_0 connection 503 (through, e.g., a via_0 109 that has been labeled 503) that connects the metal_0 layer 107 to the first signal line 205 can be greatly reduced over the prior art (where there is only a single Vss line and a single first signal connection). Consequently, by reducing the distances, the effective resistances encountered by the current may also be reduced, leading to an improvement in the Vdd IR drop of the overall structure. For example, using embodiments described herein, the IR drop may be improved from 18.44 mV to 6.91 mV while the within IR rise delay may be reduced approximately 0.04% and the within IR fall delay may be reduced about 0.72%.

Figure 6:
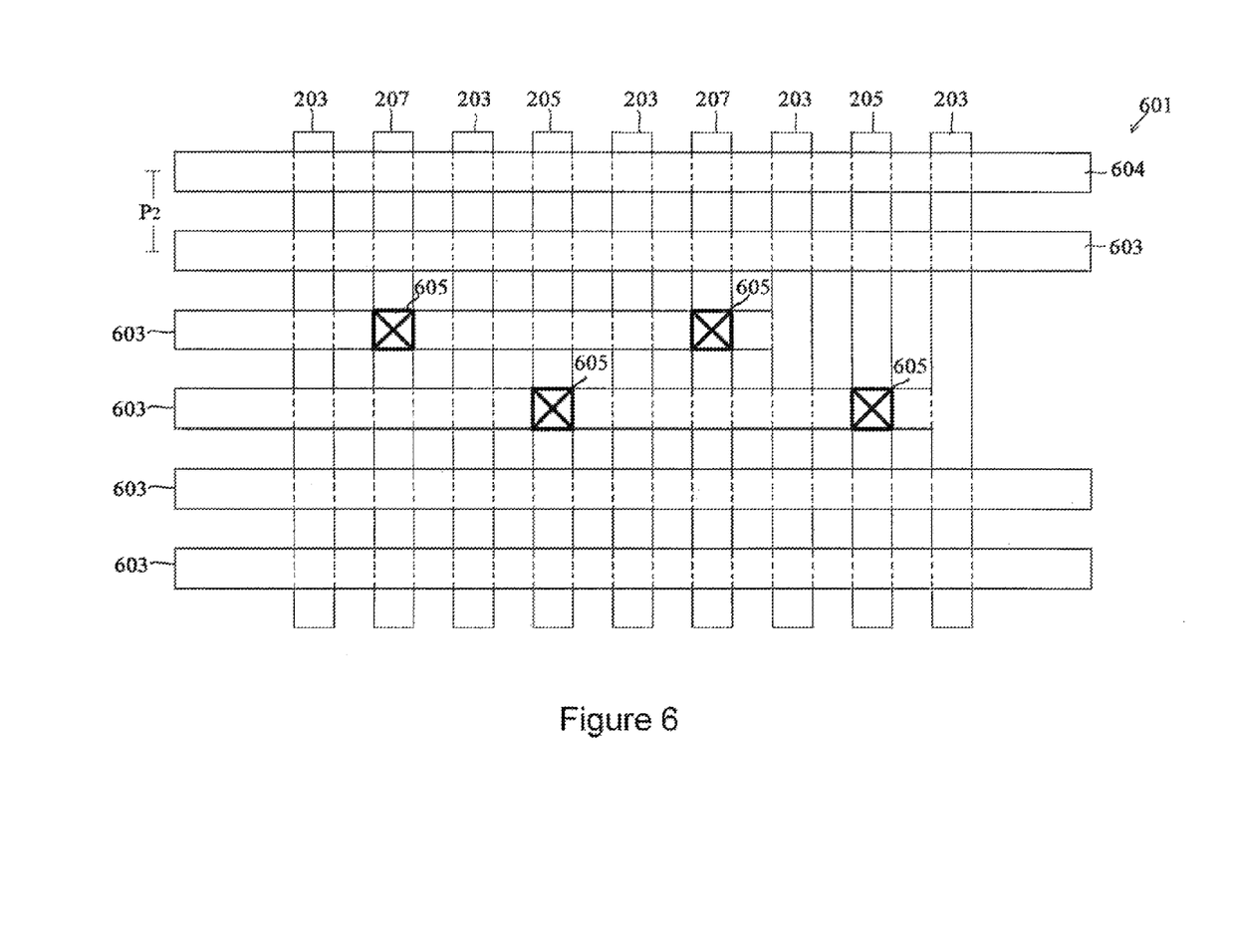
FIG. 6 illustrates a metal_2 layer layout in accordance with an embodiment.

FIG. 6 illustrates a metal_2 layer 601 that may be utilized to form connections with the metal_1 layer 201 (the layers below the metal_1 layer 201 have been excluded from FIG. 6 for clarity). The metal_2 layer 601 may be formed utilizing similar methods as those for the metal_1 layer 201 (described above with respect to FIG. 2). Additionally, the metal_2 layer 601 may comprise a series of conductive lines 603 in order to form connections to the underlying metal_1 layer 201. As illustrated, because the lines in the metal_1 layer 201 are distributed, a single straight conductive line 603 in the metal_2 layer 601 may connect to the distributed lines in the metal_1 layer 201 by forming multiple connections 605 (through, e.g., vias) along the conductive line 603. By allowing for multiple connections along the conductive line 603, multiple connections 605 can be made in a single conductive line 603 without the so-called "hammer head" approach. Accordingly, the conductive lines 603 in the metal_2 layer 601 may be formed with a consistent width of between about 32 nm and about 110 nm, such as about 71 nm. Further, by eliminating the need for the "hammer head" approach, an additional track 605 may be added to the metal_2 layer 601 (e.g., adding a sixth track where only five tracks could previously be placed), thereby improving the efficiency of the layout for the metal_2 layer 601. Such an improvement makes the layout style more friendly to manufacturing by also allowing a uniform second pitch $P_2$ of between about 64 nm and about 142 nm, such as about 103 nm, without requiring any extra manufacturing costs.

Figure 7A:
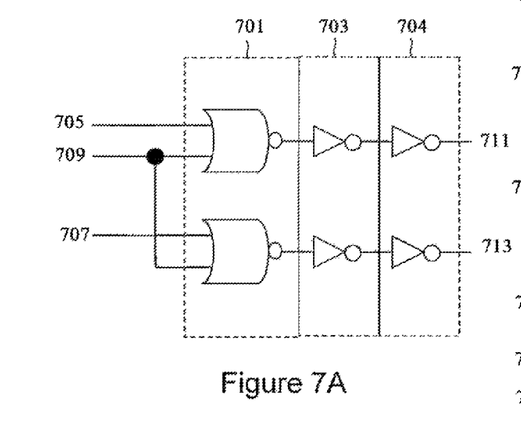
FIGS. 7A-7B illustrate a NOR gate implemented using a distributed power layout in accordance with an embodiment.
Figure 7B:
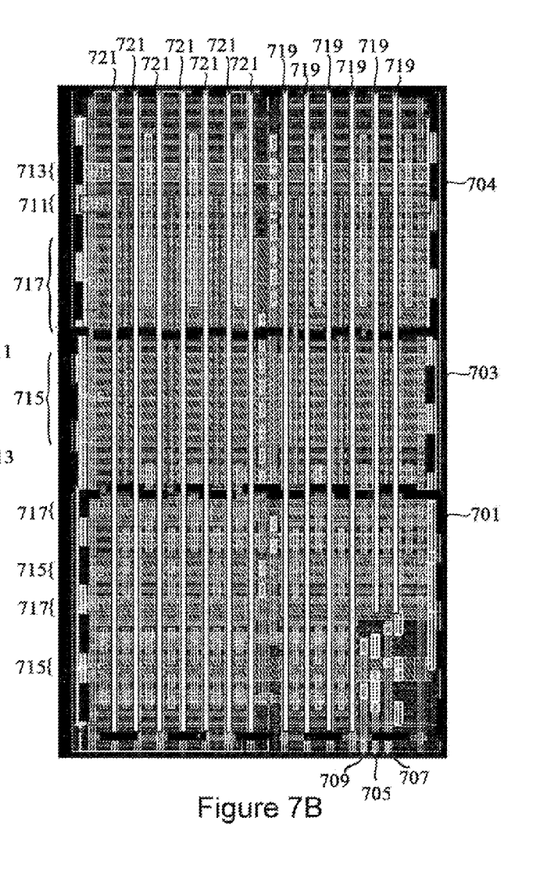

FIGS. 7A-7B illustrate yet another embodiment in which the distributed metal_1 layout may be utilized. FIG. 7A illustrates a circuit diagram of a NOR gate 701 with its inverter driver 703 and inverter driver 704, wherein the NOR gate 701 has a first input 705, a second input 707, and a clock input 709. Additionally, the NOR gate 701 and its associated drivers 703 also have a first output 711 and a second output 713.

FIG. 7B illustrates a distributed layout of the circuit diagram illustrated in FIG. 7A, with the NOR gate 701 plus inverter driver 703 and inverter driver 704. In this illustration, the first input 705, the second input 707, and the clock signal 709 are input into lines (running vertically in the Figure) which connect them to gates (which run horizontally in the Figure). Additionally, Vss source lines 715 and Vdd source lines 717 are introduced in a metal_2 layer which comprises lines running horizontally in the Figure.

Finally, with regards to the metal_1 layer, FIG. 7B illustrates a distributed power layout in the metal_1 layer (not labeled in FIG. 7B), as show by the series of distributed vertical lines, including the highlighted Vss lines 719 and the highlighted Vdd lines 721. By using the distributed power layout, the Vss lines 719 and Vdd lines 721 can make distributed contact to the underlying metal_0 layer reduce the current crowding and IR drop. For example, in this embodiment, by using the distributed layout, the delay time of the first output 711 may be improved from 80.7 psec to 80 psec, for approximately a 1% improvement.

In accordance with an embodiment a semiconductor device comprising an active area within a substrate and a first metal layer in contact with the substrate, the first metal layer comprising at least a first conductive line is provided. A second metal layer is located over the first metal layer, the second metal layer having a distributed layout of first parallel lines, wherein at least two separate ones of the first parallel lines are in contact with the first conductive line.

In accordance with another embodiment, a semiconductor device comprising an active area of a substrate and a first metal layer overlying and in contact with the active area is provided. A second metal layer is located over the first metal layer, the second metal layer comprising a first conductive line connected to a first source, a second conductive line connected to a second source different from the first source, and a third conductive line connected to the first source. The first conductive line, second conductive line and third conductive line are parallel and the second conductive line is located between the first conductive line and the third conductive line.

In accordance with yet another embodiment, a method of making a semiconductor device comprising forming a first metal layer on and in contact with an active area of a substrate, the first metal layer comprising a continuous first conductive region and forming a first contact plug and a second contact plug in contact with the first conductive region is provided. A second metal layer is formed over the first contact plug and the second contact plug. The second metal layer comprises a first set of parallel lines connected to a first source and a second set of parallel lines connected to a second source. The first set of parallel lines and the second set of parallel lines are interlaced with each other. A first one of the first set of parallel lines is connected to the first contact plug and a second one of the first set of parallel lines is connected to the second contact plug.

Although embodiments and their advantages have been described in detail, it should be understood that various changes, substitutions and alterations can be made herein without departing from the spirit and scope of the embodiments as defined by the appended claims. For example, multiple different devices instead of a multi-finger transistor or NOR gates may be used along with embodiments. Moreover, the different lines in the metal_1 layer may be placed in numerous sequences while remaining within the scope of the embodiments.

Moreover, the scope of the present application is not intended to be limited to the particular embodiments of the process, machine, manufacture, composition of matter, means, methods and steps described in the specification. As one of ordinary skill in the art will readily appreciate from the disclosure of the present embodiments, processes, machines, manufacture, compositions of matter, means, methods, or steps, presently existing or later to be developed, that perform substantially the same function or achieve substantially the same result as the corresponding embodiments described herein may be utilized according to the present embodiments. Accordingly, the appended claims are intended to include within their scope such processes, machines, manufacture, compositions of matter, means, methods, or steps.

What is claimed is:

1. A semiconductor device comprising:
a first conductive layer on a substrate, the first conductive layer comprising a first plurality of conductive lines and a second plurality of conductive lines, wherein the first plurality of conductive lines is parallel to and interleaved with the second plurality of conductive lines, at least some of the first plurality of conductive lines serving as gates for transistors formed in the substrate; and
a second conductive layer over the first conductive layer and separated therefrom by a dielectric layer, the second conductive layer comprising a third plurality of conductive lines and a fourth plurality of conductive lines parallel to and interleaved with the third plurality of conductive lines, the third and four pluralities of conductive lines being perpendicular to the first and second pluralities of conductive lines, wherein the fourth plurality of conductive lines provides connection to signals to be distributed to multiple points on the semiconductor device; and
a plurality of interlayer interconnections, each of the plurality of interlayer interconnections extending through the dielectric layer from one of the first or second pluralities of conductive lines to one of the third or fourth plurality of conductive lines.

2. The semiconductor device of claim 1, further comprising a third conductive layer over and in contact with the second conductive layer, the third conductive layer comprising a fifth plurality of conductive lines, wherein at least one of the fifth plurality of conductive is in contact with two separate ones of the second plurality of conductive lines.

3. The semiconductor device of claim 2, wherein each of the fifth plurality of conductive lines in the third conductive layer has a constant width.

4. The semiconductor device of claim 1, wherein each of the fourth plurality of conductive lines is connected to more than one of the first plurality of conductive lines.

5. The semiconductor device of claim 4, wherein the fourth plurality of conductive lines comprise Vss lines.

6. The semiconductor device of claim 1, wherein the first conductive layer comprises polycrystalline silicon.

7. The semiconductor device of claim 1, wherein the distributed layout of first, second, third and fourth pluralities of conductive lines has a uniform pitch.

8. A semiconductor device comprising:
a first conductive layer on a substrate having a first plurality of conductive lines and a second plurality of conductive lines, wherein the first plurality of conductive lines parallel to and interleaved with the second plurality of conductive lines, at least some of the first plurality of conductive lines serving as gates for transistors formed in the substrate;
a second conductive layer over the first conductive layer and separated therefrom by a dielectric layer, the second conductive layer comprising a third plurality of conductive lines and a fourth plurality of conductive lines parallel to and interleaved with the third plurality of conductive lines, the third and four pluralities of conductive lines being perpendicular to the first and second pluralities of conductive lines, a first plurality of the fourth plurality of conductive lines connected to a first source, a second plurality of the fourth plurality of conductive lines connected to a second source different from the first source; and
a plurality of interlayer interconnections, each of the plurality of interlayer interconnections extending through the dielectric layer from one of the first or second pluralities of conductive lines to one of the third or fourth plurality of conductive lines.

9. The semiconductor device of claim 8, wherein the one of the first pluralities of conductive lines and one of the third pluralities of conductive line are both electrically connected to a first region of an active area in the substrate.

10. The semiconductor device of claim 8, wherein the first source is a Vss source and the second source is a first signal source.

11. The semiconductor device of claim 8, wherein the second conductive layer further comprises a third plurality of the fourth plurality of conductive lines connected to a third source.

12. The semiconductor device of claim 8, further comprising a third conductive layer over the second conductive layer, the third conductive layer comprising a fifth plurality of conductive lines, the fifth plurality of conductive lines in electrical contact with both one of the first plurality of conductive lines and one of the third plurality of conductive lines.

13. The semiconductor device of claim 12, wherein each of the lines of the fifth plurality of conductive lines in the third conductive layer has a constant width.

14. The semiconductor device of claim 8, wherein the first and second pluralities of conductive lines comprises polycrystalline silicon.

15. A semiconductor device comprising:
a first conductive layer on a substrate, the first conductive layer having a first plurality of conductive lines and a second plurality of conductive lines, parallel to and interleaved with the first plurality of conductive lines, at least some of the first plurality of conductive lines serving as gates for transistors formed in the substrate and wherein at least some of the plurality of second conductive lines in contact with the substrate; and
a second conductive layer over the first conductive layer and separated therefrom by a dielectric layer, the second conductive layer comprising a third plurality of conductive lines and a fourth plurality of conductive lines parallel to and interleaved with the third plurality of conductive lines, the third and four pluralities of conductive lines being perpendicular to the first and second pluralities of conductive lines, wherein the fourth plurality of conductive lines provides connection to signals to be distributed to multiple points on the semiconductor device; and
a plurality of interlayer interconnections, each of the plurality of interlayer interconnections extending through the dielectric layer from one of the first or second pluralities of conductive lines to one of the third or fourth plurality of conductive lines.

16. The semiconductor device of claim 15, wherein at least one of the fourth plurality of conductive lines is in contact with two separate ones of the first and second pluralities of conductive lines in the first conductive layer.

17. The semiconductor device of claim 16, wherein each of the fourth plurality of conductive lines has a constant width.

18. The semiconductor device of claim 15, wherein the fourth plurality of conductive lines is connected to a different source than the third plurality of conductive lines or the second plurality of conductive lines.

19. The semiconductor device of claim 18, wherein the third plurality of conductive lines and the second plurality of conductive lines are Vss lines, and the fourth plurality of conductive lines is a signal line.

20. The semiconductor device of claim 15, wherein a distributed layout of the first conductive layer has a uniform pitch.

\* \* \* \* \*